United States Patent
Nakajima

(10) Patent No.: US 7,849,909 B2
(45) Date of Patent: Dec. 14, 2010

(54) PRODUCTION METHOD OF THERMOELECTRIC SEMICONDUCTOR ALLOY, THERMOELECTRIC CONVERSION MODULE AND THERMOELECTRIC POWER GENERATING DEVICE

(75) Inventor: Kenichiro Nakajima, Chichibu (JP)

(73) Assignee: Showa Denko K.K., Tokyo (JP)

( * ) Notice: Subject to any disclaimer, the term of this patent is extended or adjusted under 35 U.S.C. 154(b) by 392 days.

(21) Appl. No.: 11/793,439

(22) PCT Filed: Dec. 22, 2005

(86) PCT No.: PCT/JP2005/024186

§ 371 (c)(1),
(2), (4) Date: Jun. 20, 2007

(87) PCT Pub. No.: WO2006/068325

PCT Pub. Date: Jun. 29, 2006

(65) Prior Publication Data

US 2008/0092940 A1    Apr. 24, 2008

Related U.S. Application Data

(60) Provisional application No. 60/640,242, filed on Jan. 3, 2005.

(30) Foreign Application Priority Data

Dec. 24, 2004    (JP) .............................. 2004-374218

(51) Int. Cl.
*B22D 30/00*    (2006.01)

(52) U.S. Cl. ...................................... 164/122; 420/590
(58) Field of Classification Search ................. 164/122, 164/128, 348; 420/590
See application file for complete search history.

(56) References Cited

U.S. PATENT DOCUMENTS

| 2004/0261833 | A1 | 12/2004 | Ono et al. |
| 2005/0172994 | A1 | 8/2005 | Shutoh et al. |

FOREIGN PATENT DOCUMENTS

| JP | 2001-189495 A | | 7/2001 |
| JP | 2003-197985 A | * | 7/2003 |
| JP | 2004-119647 A | | 4/2004 |
| JP | 2004-253618 A | | 9/2004 |

(Continued)

OTHER PUBLICATIONS

*Polytechnical Dictionary*, edited by A. Yu. Ishlinsky, Moscow, "Soviet Encyclopedia," p. 530 (1989).

(Continued)

*Primary Examiner*—Kevin P Kerns
(74) *Attorney, Agent, or Firm*—Sughrue Mion, PLLC

(57) ABSTRACT

The present invention provides a method for producing a half Heuslar alloy including quench-solidifying a molten alloy at a cooling rate of $1\times10^2$ to $1\times10^{3}$° C./sec to produce a Heuslar alloy represented by the formula: ABC (wherein A and B each is at least one member selected from transition metals such as Fe, Co, Ni, Ti, V, Cr, Zr, Hf, Nb, Mo, Ta and W, and C is at least one member selected from Group 13 or 14 element such as Al, Ga, In, Si, Ge and Sn), and a high-performance thermoelectric power generating device using the thermoelectric semiconductor alloy.

2 Claims, 4 Drawing Sheets

FOREIGN PATENT DOCUMENTS

| JP | 2004-356607 A | | 12/2004 |
|---|---|---|---|
| SU | | 135528 | 2/1961 |
| WO | WO 03/019681 A1 | | 3/2003 |
| WO | WO 2004/017435 A1 | * | 2/2004 |
| WO | WO 2004/095594 A1 | | 11/2004 |

OTHER PUBLICATIONS

Yoshinori Hanada et al., Seebeck coefficient of $(Fe,V)_3$ Al alloys., Journal of Alloys and Compounds, Nov. 14, 2001, p. 63-68, vol. 329, No. 1-2, XP004309671.

T. Kanomata et al., "Magnetic and electrical properties of $Fe_{2+x}V_{1-x}Al$.", Journal of Alloys and Compounds, Apr. 12, 2001, p. 390-394, vol. 317-318, XP004233233.

Hitoshi Matsuura et al., "Doping Effects on Thermoelectric Properties of the Pseudogap $Fe_2VAl$ System.", Journal of the Japan Institute of Metals, 2002, p. 767-771, vol. 66, No. 7, XP008064324.

D. Satula et al., "Structural and magnetic properties of Fe-Cr-Al alloys with $DO_3$-type structure.", Journal of Magnetism and Magnetic Materials, 1997, p. 240-252, vol. 169, XP004084048.

Z.H. Liu et al., "Martensitic transformation and magnetic properties of Heusler alloy Ni-Fe-Ga ribbon.", Physics Letters A, 2004, p. 214-220, vol. 329, No. 3, XP004526121.

Z.H. Liu et al., "Martensitic transformation and shape memory effect in ferromagnetic Heusler alloy $Ni_2FeGa$.", Applied Physics Letters, Jan. 20, 2003, p. 424-426, vol. 82, No. 3, XP012034592.

R.Y. Umetsu et al., "Magnetic properties and band structures of half-metal-type $Co_2CrGa$ Heusler alloy.", Applied Physics Letters, Sep. 13, 2004, p. 2011-2013, Vo. 85, No. 11, XP012062528.

K. Kobayashi et al., "Phase separation and magnetic properties of half-metal-type $Co_2Cr_{1-x}Fe_xAl$ alloys.", Applied Physics Letters, Nov. 15, 2004, p. 4684-4686, vol. 85, No. 20, XP012063431.

Naoki Shutoh et al., "Thermoelectric Properties of the $Ti_x(Zr_{0.5}Hf_{0.5})_{1-x}NiSn$ Half-Heusler Compounds.", Thermoelectrics, 2003 $22^{nd}$ International Conference on Thermoelectrics, 2003, p. 312-315, XP008064313.

Yamanaka et al., Kinzoku (Metals), 2004, p. 54-57, vol. 74, No. 8.

* cited by examiner

US 7,849,909 B2

PRODUCTION METHOD OF THERMOELECTRIC SEMICONDUCTOR ALLOY, THERMOELECTRIC CONVERSION MODULE AND THERMOELECTRIC POWER GENERATING DEVICE

This application claims the benefit pursuant to 35 U.S.C. §119 (e) of U.S. Provisional Application No. 60/640,242 filed on Jan. 3, 2005, and priority is claimed on Japanese Patent Application No. 2004-374218, filed Dec. 24, 2004, the contents of which are incorporated herein by reference.

TECHNICAL FIELD

The present invention relates to a production method of a thermoelectric semiconductor alloy, and a high-performance thermoelectric power generating device using a thermoelectric semiconductor alloy produced by the production method.

BACKGROUND ART

To cope with the regulation for emission of carbonic acid gas and energy conservation, thermoelectric power generation utilizing thermoelectric conversion of converting waste heat directly into electricity is attracting attention. This thermoelectric conversion is effected by such a mechanism that when temperature difference is generated by assigning one end of n-type and p-type semiconductors to a high temperature and another end to a low temperature, potential difference is caused and electricity is obtained. The principle thereof has long been known.

Conventional thermoelectric power generation had been used only for limited uses such as application to space probe, because the semiconductor used for the power generation is very expensive, but in the late 1990s, a high-performance semiconductor was newly discovered and since then, aggressive development such as study on materials for practical use, production of modules and packaging test has been made.

Examples of the substance taken notice of as a next-generation thermoelectric semiconductor include filled skutterudite type, cobalt oxide, silicide and Heuslar type. It is recognized that with these materials, high electric conductivity, high Seebeck coefficient and low thermal conductivity can be achieved at the same time. For enhancing the performance of each material, a great deal of effort is being made.

Along with elucidation of properties as a semiconductor, alloys having a Heuslar or half Heuslar structure have come to draw attention as an excellent thermoelectric semiconductor. The Heuslar alloy is represented by the formula: $A_{3-x}B_xC$, wherein A and B are each a transition metal, C is a Group III or IV metal, and a space group is Fm3m. The half Heuslar alloy is represented by the formula: ABC, wherein A and B are each a transition metal, C is a Group III or IV metal, and the space group is F43m.

In the case of using a Heuslar alloy as a thermoelectric semiconductor, the design is difficult due to numerous combinations of elements, and one proposed guideline therefor is a method of using an electronic number as a rough standard.

With respect to the thermoelectric semiconductor having a Heuslar structure, for example, Nishino et al. have reported an $Fe_2VAl$ system of giving an output factor comparable to that of Bi—Te system in the vicinity of room temperature. The $Fe_2VAl$ system is expected in view of the theoretical value to exhibit thermoelectric performance higher than the Bi—Te system and noteworthy as a practical material.

At present, for the production of a half Heuslar alloy as a thermoelectric conductor for use in middle and high temperature regions, a heat treatment for a long time of about 10 days is performed. Considering mass production, the heat treatment for such a long time is not preferred because this causes increase in the cost.

Also, it is known that in the TiNiSn system having a half Heuslar structure, when Ti is replaced by Zr or Hr, both high output factor and low thermal conductivity can be achieved in a high temperature region of 300° C. or more and the dimensionless figure of merit ZT as a rough standard for the performance of a practical material exceeds 1.0 at 693K. The performance of this system is expected to be enhanced in future.

When a Heuslar alloy is produced by casting, high melting point metals such as Ti, V and Zr are contained therein in many cases and a skilled technique is required for the quench-solidification of high-temperature molten metal. Also, a casting technique in vacuum induction furnace and inert atmosphere is necessary because of handling of a readily oxidizable metal as represented by Ti.

[Patent Document 1] JP-A-2001-189495 (the term "JP-A" as used herein means an "unexamined published Japanese patent application")

[Patent Document 2] WO03/019681 A1

[Patent Document 3] JP-A-2004-253618

[Patent Document 4] JP-A-2004-119647

[Non-Patent Document 1] Yamanaka et al., Kinzoku (Metals), Vol. 74 (8), page 54 (2004)

[Non-Patent Document 2] Matsuura et al., Journal of Japan Institute of Metals, Vol. 66 (7), page 767 (2002)

[Non-Patent Document 3] S. Shuto et al., Proc. 22nd International Conference on Thermoelectrics, 312 (2003)

In most of conventional methods for producing a thermoelectric semiconductor, the alloy raw material is melted by arc melting, and annealing of the molten alloy for a long time is performed multiple times or a shaped body is produced at high temperature under high pressure by using a special heat shaping apparatus. Thus, the productivity is not taken account of at all.

In the light of these problems, an object of the present invention is to provide a high-performance thermoelectric conversion module, a high-performance thermoelectric power generating device, and a thermoelectric semiconductor alloy for constituting such a module or device.

The present inventors have found that when a raw material alloy is melted and the molten alloy is quench-solidified at an appropriate cooling rate, a thermoelectric semiconductor alloy comprising nearly a single phase can be produced.

DISCLOSURE OF INVENTION

The present invention has been accomplished based on this finding and includes the following inventions.

(1) A method for producing a Heuslar alloy, comprising quench-solidifying a molten alloy at a cooling rate of $1\times10^2$ to $1\times10^{3}$° C./sec to produce a Heuslar alloy represented by the formula: $A_{3-x}B_xC$ (wherein A and B each is at least one member selected from transition metals such as Fe, Co, Ni, Ti, V, Cr, Zr, Hf, Nb, Mo, Ta and W, and C is at least one member selected from Group 13 or 14 elements such as Al, Ga, In, Si, Ge and Sn).

(2) A method for producing a Heuslar alloy, comprising quench-solidifying a molten alloy at a cooling rate of $1\times10^2$ to $1\times10^{3}$° C./sec to produce a Heuslar alloy represented by the formula: ABC (wherein A and B each is at least one member selected from transition metals such as Fe, Co, Ni, Ti, V, Cr, Zr, Hf, Nb, Mo, Ta and W, and C is at least one member selected from Group 13 or 14 elements such as Al, Ga, In, Si, Ge and Sn).

(3) An alloy produced by the production method described in (1) or (2).

(4) The alloy as described in (3), wherein the ratio of strongest peak of the Heuslar phase or half Heuslar phase is 85% or more.

(5) The alloy as described in (3) or (4), wherein the average particle diameter is from 1 to 100 μm.

(6) A thermoelectric conversion element using the alloy described in any one of (3) to (5).

(7) A thermoelectric conversion module using the thermoelectric conversion element described in (6).

(8) A thermoelectric power generating device using the thermoelectric conversion module described in (7).

(9) A waste heat recovery system using the thermoelectric power generating device described in (8).

(10) A solar heat utilizing system using the thermoelectric power generating device described in (8).

(11) A Heuslar alloy represented by the formula: $Fe_2V_{1-x}A_xAl_{1-y}B_y$ (wherein A is at least one member selected from transition metals such as Co, Ni, Ti, V, Cr, Zr, Hf, Nb, Mo, Ta and W, B is at least one member selected from Group 13 or 14 elements such as Al, Ga, In, Si, Ge and Sn, $0 \leq x \leq 0.8$, $0 \leq y \leq 0.3$).

(12) A half Heuslar alloy represented by the formula: $Ti_{1-x}A_xNi_{1-y}B_ySn_{1-z}C_z$ (wherein each of A and B is at least one member selected from transition metals such as Co, Ni, Ti, V, Cr, Zr, Hf, Nb, Mo, Ta and W, C is at least one member selected from Groups 13 to 15 elements such as Al, Ga, In, Si, Ge and Sn, $0 \leq x \leq 0.8$, $0 \leq y \leq 0.9$, $0 \leq z \leq 0.3$).

(13) A method for producing the Heuslar alloy represented by the formula: $Fe_2V_{1-x}A_xAl_{1-y}B_y$ (wherein A is at least one member selected from transition metals such as Co, Ni, Ti, V, Cr, Zr, Hf, Nb, Mo, Ta and W, B is at least one member selected from Group 13 or 14 elements such as Al, Ga, In, Si, Ge and Sn, $0 \leq x \leq 0.8$, $0 \leq y \leq 0.3$), comprising quench-solidifying a molten alloy at a cooling rate of $1 \times 10^2$ to $1 \times 10^{3\circ}$ C./sec.

(14) A method for producing the half Heuslar alloy represented by the formula: $Ti_{1-x}A_xNi_{1-y}B_ySn_{1-z}C_z$ (wherein each of A and B is at least one member selected from transition metals such as Co, Ni, Ti, V, Cr, Zr, Hf, Nb, Mo, Ta and W, C is at least one member selected from Groups 13 to 15 elements such as Al, Ga, In, Si, Ge and Sn, $0 \leq x \leq 0.8$, $0 \leq y \leq 0.9$, $0 \leq z \leq 0.3$), comprising quench-solidifying a molten alloy at a cooling rate of $1 \times 10^2$ to $1 \times 10^{3\circ}$ C./sec.

According to the present invention, a thermoelectric conversion module and a thermoelectric power generating device each exhibiting high performance over a wide temperature range from a low temperature near room temperature to a high temperature region of 700° C. or more can be provided at a low cost. Also, a production method of a Heuslar alloy or half Heuslar alloy for the production of such a module or device can be provided.

When the method of the present invention is employed, a trace element can be uniformly doped in the entire alloy or can be made to replace a specific site in the crystal structure, whereby replacement of a specific site is facilitated, for example, the V or Al site of $Fe_2VAl$ may be partially replaced by Ti or Si, respectively, or Ti or Sn of TiNiSn may be partially replaced by Zr or Sb, respectively.

BEST MODE FOR CARRYING OUT THE INVENTION

Figure 1:
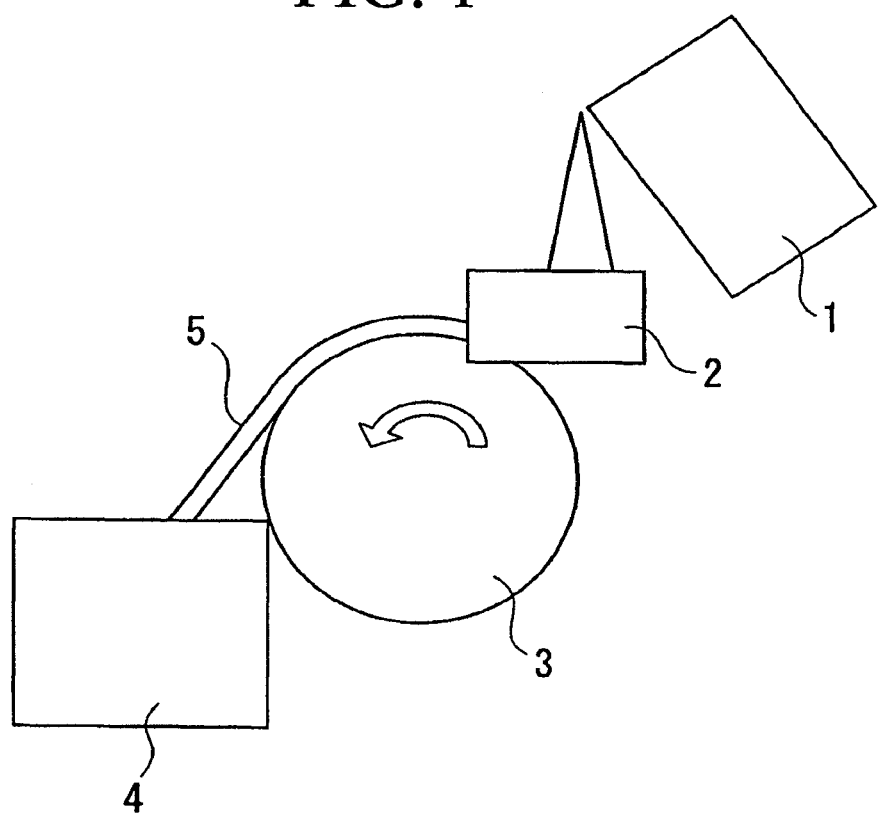
FIG. 1 is a schematic view showing a strip casting apparatus used for the production of alloy by quench-solidification.

The Heuslar alloy according to the present invention is represented by the formula: $A_{3-x}B_xC$, wherein A and B each is a transition metal, C is a Group III or IV element, and the space group is Fm3m. The half Heuslar alloy is represented by the formula: ABC, wherein A and B each is similarly a transition metal, C is a Group III or IV metal, and the space group is F43m.

As an example of Heuslar alloy of the present invention, $Fe_2VAl$ type can be exemplified, and thermoelectric performance can be further improved by substituting a part of V of a p-type element with Ti, or substituting a part of Al of a n-type element with Si.

For example, as for a p-type element, in the formula $Fe_2V_{1-x}Ti_xAl$, it is preferable to set $0<x \leq 0.8$, and it is more preferable to set $0.1<x \leq 0.35$, thereby improving further thermoelectric performance.

For example, as for an n-type element, in the formula $Fe_2VAl_{1-y}Si_y$, it is preferable to set $0<y \leq 0.3$, and it is more preferable to set $0.1 \leq y \leq 0.2$, thereby improving further thermoelectric performance.

Moreover, as an example of half Heuslar alloy of the present invention, TiNSn type can be exemplified, and thermoelectric performance can be further improved by substituting a part of Ti thereof with Zr, and substituting a part of Sn thereof with Sb. For example, in the formula $Ti_{1-x}Zr_xNiSn_{1-y}Sb_y$, it is preferable to set $0<x \leq 0.8$, and it is more preferable to set $0.3 \leq x \leq 0.6$. Moreover, setting to be $0<y \leq 0.3$ is preferable, setting to be $0<y \leq 0.1$ is further preferable, and it is possible to improve thermoelectric performance mostly by setting to be both $0.3 \leq x \leq 0.6$ and $0<y \leq 0.1$.

The electrical properties and thermal properties of the Heuslar alloy according to the present invention can be adjusted by adding, as an additive, B, C, Mg, Cu, Zn or a rare earth metal such as Y, La, Ce, Nd, Pr, Dy, Tb, Ga and Yb. In a preferred embodiment of the present invention, the ratio of strongest peak of the Heuslar phase or half Heuslar phase is preferably 85% or more, more preferably 90% or more. This peak ratio is defined by IHS/(IHS+IA+IB)×100(%) from a strongest peak (IHS) of the measured Heuslar phase or half Heuslar phase, a strongest peak intensity (IA) of an impurity phase A and a strongest peak intensity (IB) of an impurity phase B in the powder X-ray diffraction measurement.

When combining p-type and n-type thermoelectric semiconductors comprising the Heuslar alloy of the present invention, these semiconductors may be electrically connected through an electrode or may be directly connected through an antidiffusion layer.

The crystal grain diameter of the thermoelectric semiconductor produced from the Heuslar alloy is preferably smaller in view of reducing the thermal conductivity by the effect of lattice scattering, specifically, 100 μm or less, and from the standpoint of preventing abnormal grain growth due to excessive sintering, inhibiting dust explosion or enhancing powder-filling property, more preferably from 10 to 50 μm.

In grinding the Heuslar alloy, the grinding method is not limited and known methods all can be employed but, for example, a ball mill, a pot mill, an attritor, a pin mill or a jet mill can be used.

The jet mill is preferred despite its relatively high grinding cost, because a continuous operation can be performed, a necessary measure for the prevention of oxidation or dust explosion can be easily taken, and even a fine powder of about 20 μm can be processed in a relatively short time.

The quench-solidified alloy obtained in the present invention has good grindability and therefore, a fine powder of 20 μm or less can be obtained in a shorter time at a high yield.

The shaping method of the alloy is not particularly limited, but when a powder of several μm obtained by pulverizing the alloy is shaped under a pressure of 0.5 to 5.0 t/cm$^2$ and the obtained green compact is sintered in an inert atmosphere at 1,100 to 1,400° C., a thermoelectric semiconductor element comprising fine crystal grains having a crystal grain diameter of 100 μm or less can be produced.

The powder produced from the alloy obtained as above already comprises only a Heuslar or half Heuslar phase and therefore, when shaped into a green compact by uniaxial shaping and sintered in an inert gas such as argon or in vacuum, a sintered body comprising a Heuslar structure or a half Heuslar phase can be easily produced. By processing such a sintered body into a predetermined shape and connecting p-type and n-type, a thermoelectric conversion module can be produced.

Figure 7:
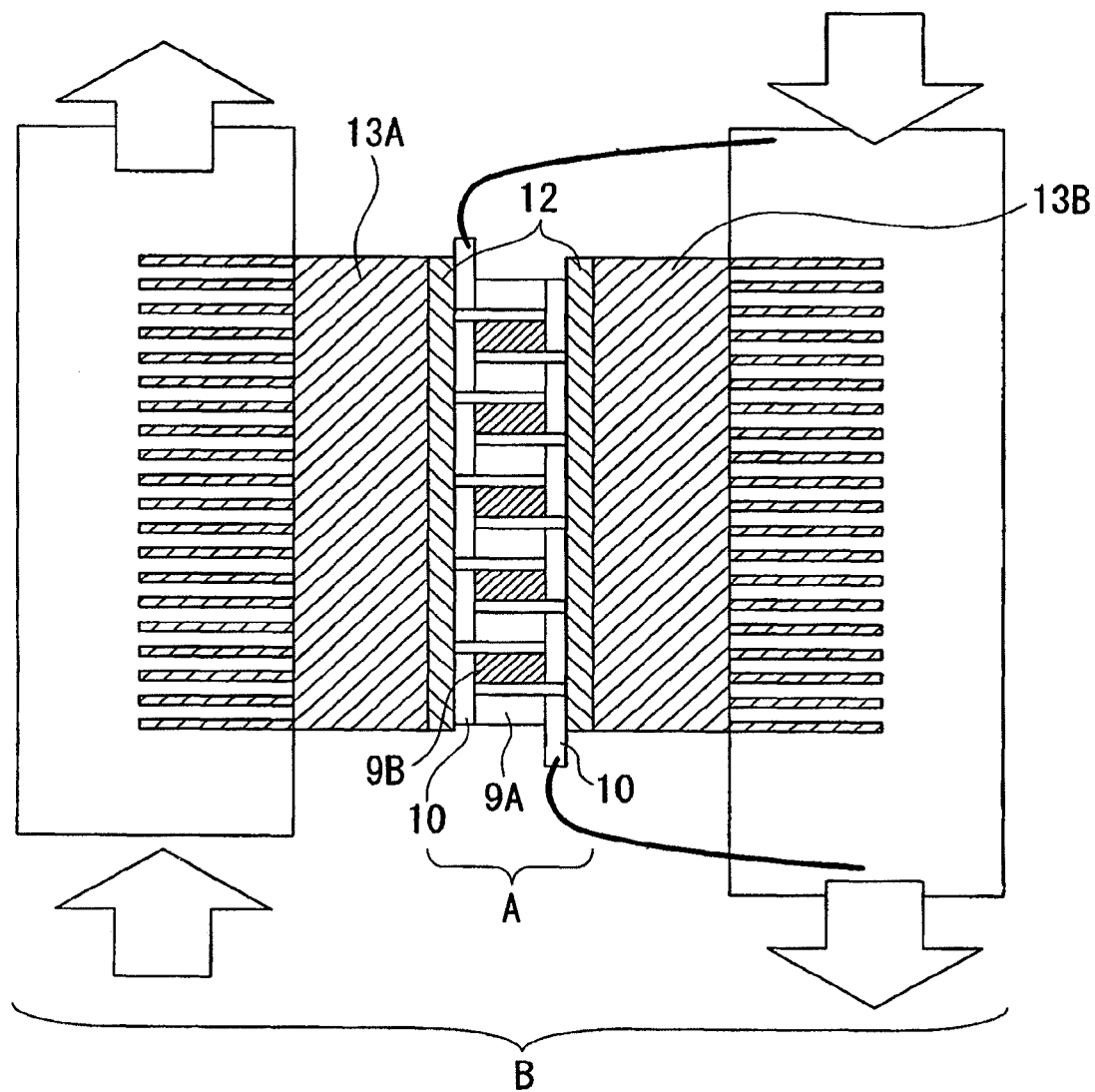
FIG. 7 is a plan view showing one example of the thermoelectric conversion module.

The thermoelectric conversion module A and thermoelectric power generating system, which are preferred embodiments of the present invention, are not particularly limited in their construction, but examples thereof include a thermoelectric conversion system B shown in FIG. 7. As shown in FIG. 7, a heat exchanger (13A or 13B) such as heat sink is provided on both sides of a thermoelectric conversion module A to construct the system.

In the heat exchangers 13A and 13B, a plurality of fin materials is erected on one surface side of a substrate. In the case where the substrate is a metal plate, an insulating material (insulating layer) is preferably disposed on the outer side surface of each electrode 10 or on the entire surface of the substrate so as to prevent a plurality of electrodes 10 from shorting. When a DC current is passed to the thermoelectric conversion module group B in this mode, the temperature becomes low at one part and becomes high at another part and therefore, this can be used as a cooling/heating source or a thermoelectric power generating system.

The p-type semiconductor thermoelectric element 9A and n-type semiconductor thermoelectric element 9B constituting the thermoelectric device are electrically connected, for example, in series or in parallel to fabricate a thermoelectric conversion module A. The high-temperature contact side of the fabricated thermoelectric device is closely contacted with the heat exchanger 13A on the waste heat side through an insulator 12, and the low-temperature contact side of the thermoelectric device is closely contacted with the heat exchanger 13B on the cooling water side through an insulator 12. In the thus-fabricated thermoelectric conversion system B, a temperature difference is generated in each of the p-type semiconductor thermoelectric element 9A and n-type semiconductor thermoelectric element 9B connected to the high-temperature contact side and low-temperature contact side, as a result, electricity according to the temperature difference based on the Seebeck effect is generated by thermoelectric conversion.

When the thermoelectric conversion system B produced by the present invention is employed, not only waste heat on a large scale including those in various industrial furnaces and incinerators but also waste heat such as exhaust gas from various cogenerations, water heaters and automobiles, and natural energy (e.g., ground heat, solar heat) can be utilized with high efficiency. Accordingly, the thermoelectric conversion module A of the present invention is suitable for waste heat recovery system, solar heat utilizing system and Peltier cooling/heating system, atomic power thermoelectric generating system, and biomass system.

The present invention is described in greater detail below by referring to Examples, but the present invention is not limited to these Examples.

Example 1

Sponge Ti (purity: 99% or more), sponge Zr (purity: 99% or more), electrolytic Ni (purity: 99% or more) and Sn metal (purity: 99.9% or more) were weighed to give a half Heuslar-type $(Ti_xZr_{1-x})NiSn$ composition after casting, and high-frequency melted at a temperature up to 1,700° C. under 0.1 MPa in an Ar atmosphere. Thereafter, by using a strip casting apparatus shown in FIG. 1, the molten metal was poured from the crucible 1 through the tundish 2 on the water-cooled copper roll 3 rotating at a spherical velocity of 0.9 m/sec to produce an alloy flake 5, and the alloy flake was collected in the container 4. The average thickness of the alloy flake 5 was 0.25 mm. In this casting, the cooling rate was estimated to be about 7×10$^{2°}$ C./sec.

Figure 2:
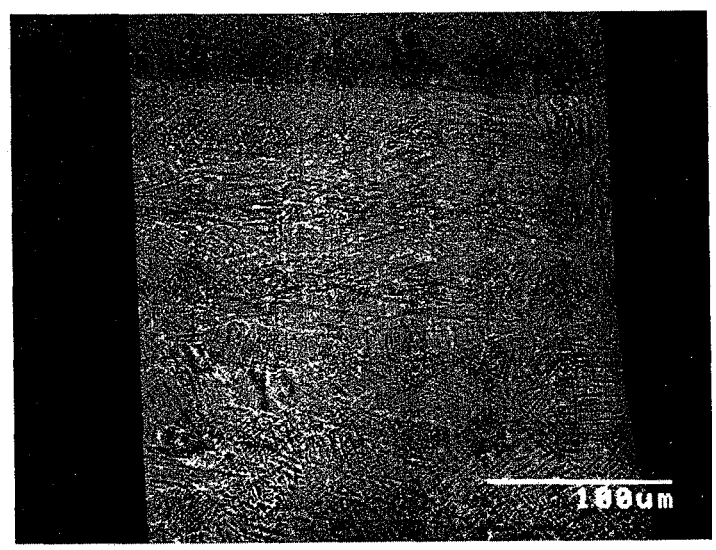
FIG. 2 is a back scattered electron image of quench-solidified TiNiSn alloy.
Figure 3:
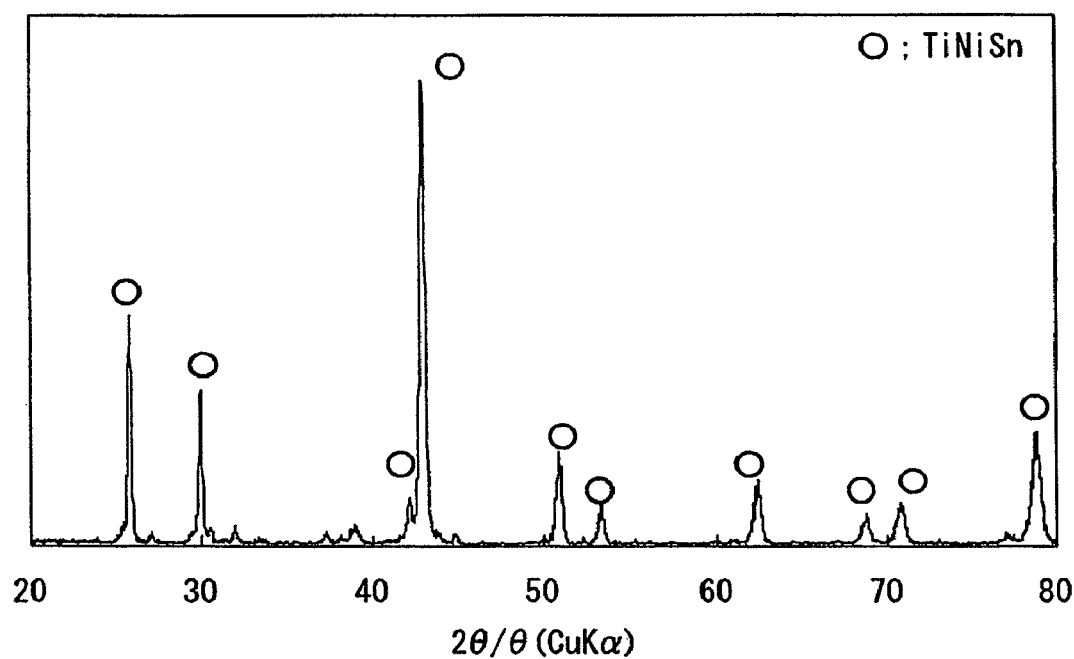
FIG. 3 is an X-ray diffraction pattern of quench-solidified TiNiSn alloy.

FIG. 2 is a back scattered electron image showing the cross section of the alloy obtained as above. As seen from this, the alloy flake has a uniform structure in the entire region. Also, it is known from the X-ray diffraction pattern of FIG. 3 that the structure is a half Heuslar structure. The ratio of strongest peak of the TiNiSn half Heuslar phase was 100%.

This alloy was ground to 200 μm or less by a disc mill and then pulverized at 0.5 MPa in a nitrogen steam by a jet mill, NPK-100NP manufactured by Nippon Pneumatic Mfg. Co., Ltd. The average particle size d50 of the obtained powder was 3.0 μm. The yield of the powder was 80% based on the amount charged.

The obtained powder was shaped into a size of 15 mm×15 mm×30 mm under a shaping pressure of 1.0 t/cm$^2$ by a shaping machine in a glove box controlled to an oxygen concentration of 300 ppm or less, and then kept at 1,200° C. for 3 hours in vacuum, thereby obtaining a sintered body.

A block of 4 mm×4 mm×15 mm was cut out from the sintered body and measured for the Seebeck coefficient α, electric conductivity ρ and power factor Pf=α$^2$/ρ at 200 to 500° C. by using a thermoelectric property evaluating apparatus, ZEM-2 manufactured by ULVAC-RIKO, Inc. These measurement results are shown in Table 1.

Comparative Example 1

Sponge Ti (purity: 99% or more), sponge Zr (purity: 99% or more), electrolytic Ni (purity: 99% or more) and Sn metal (purity: 99.9% or more) were weighed to give a half Heuslar-type $(Ti_xZr_{1-x})NiSn$ composition after casting, and high-frequency melted at a temperature up to 1,700° C. under 0.1 MPa in an Ar atmosphere. Thereafter, the alloy was solidified by using a cast iron mold in a width of 20 mm. The cooling rate at this time was estimated to be not higher than 1×10$^{2°}$ C./sec.

Figure 4:
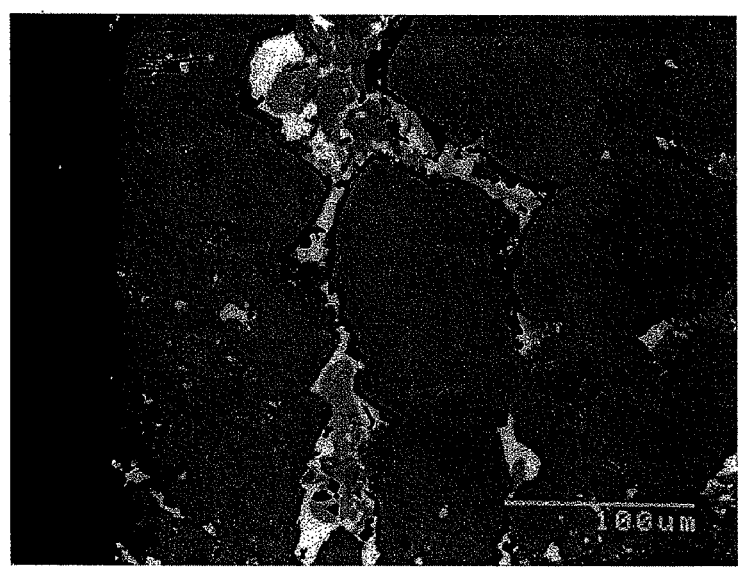
FIG. 4 is a back scattered electron image of normally cooled TiNiSn alloy.

FIG. 4 is a back scattered electron image showing the cross section of the alloy obtained as above. As seen from this, a plurality of phases non-uniformly is present in the alloy. The ratio of strongest peak of the half Heuslar phase was 80%.

Figure 5:
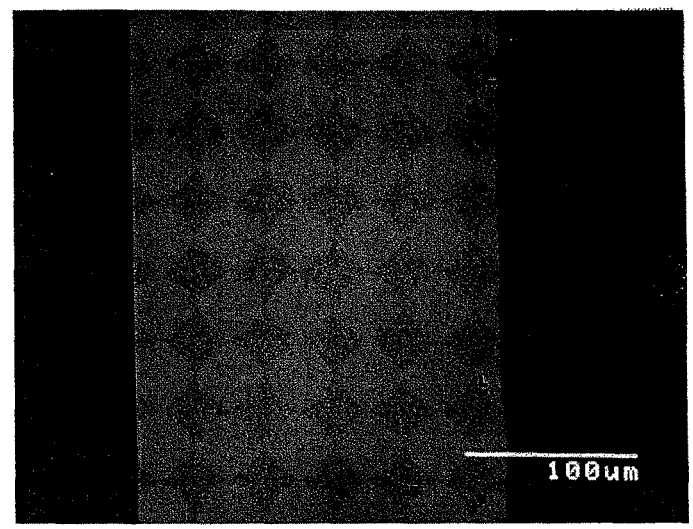
FIG. 5 is a back scattered electron image of quench-solidified $Fe_2VAl$ alloy.
Figure 6:
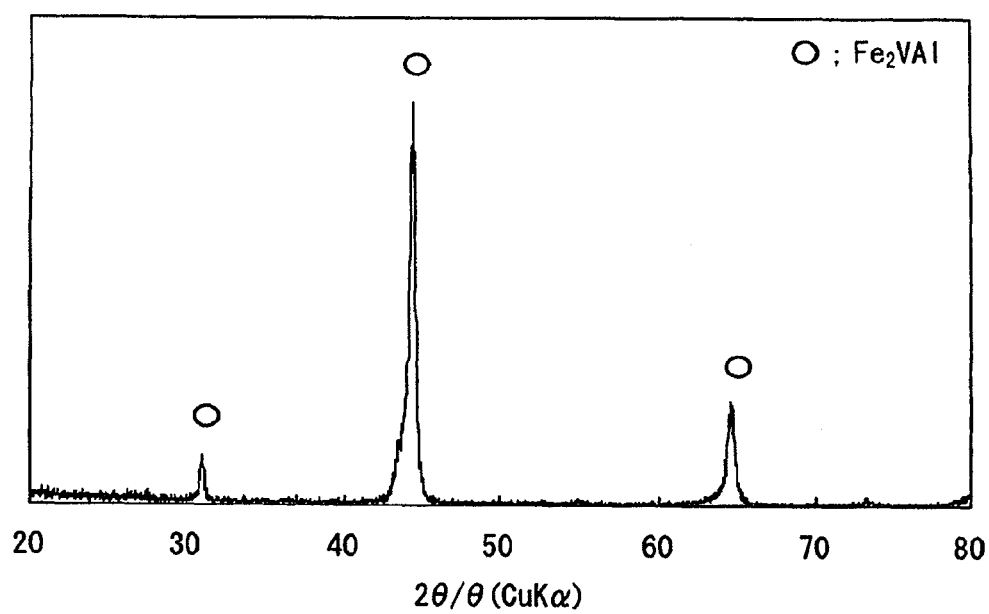
FIG. 6 is an X-ray diffraction pattern X-ray diffraction pattern of quench-solidified Fe2VAl alloy.

A block of 4 mm×4 mm×15 mm was cut out from the alloy flake after casting and measured for the Seebeck coefficient α, electric conductivity ρ and power factor Pf=α$^2$/ρ at 200 to 500° C. by using a thermoelectric property evaluating apparatus, ZEM-2 manufactured by ULVAC-RIKO, Inc. These measurement results of Example 1 and Comparative Example 1 are shown in Table 1. As seen from these results, the performance was apparently decreased as compared with Example 1.

container 4. The average thickness of the alloy flake 5 was 0.28 mm. In this casting, the cooling rate was estimated to be about 7×10$^{2\circ}$ C./sec. FIG. 5 is a back scattered electron image showing the cross section of the alloy obtained, and FIG. 6 is a powder X-ray diffraction pattern of the alloy. As seen from these, a Heuslar alloy comprising a single phase can be obtained by the quench-solidification method. The ratio of strongest peak of the Fe$_2$VAl was 100%.

This alloy was ground to 200 μm or less by a stamp mill and then pulverized at 0.5 MPa in a nitrogen steam by a jet mill, NPK-100NP manufactured by Nippon Pneumatic Mfg. Co.,

TABLE 1

Thermoelectric Properties of Half Heuslar Element Ti—Ni—Sn

| Type | Sample | | Temperature of Sample | Resistivity (σ = Ω · m) | Seebeck Coefficient (α = V/° C.) | Power Factor (α$^2$σ$^{-1}$) |
|---|---|---|---|---|---|---|
| n | Example 1 | (Ti$_{0.5}$Zr$_{0.5}$)Ni—Sn$_{0.998}$Sb$_{0.002}$ | Test piece 1 | 198.1 | 1.41E−05 | −2.10E−04 | 3.14E−03 |
| | | | | 296.4 | 1.42E−05 | −2.16E−04 | 3.29E−03 |
| | | | | 394.5 | 1.37E−05 | −2.17E−04 | 3.43E−03 |
| | | | | 492.5 | 1.32E−05 | −2.12E−04 | 3.41E−03 |
| | | | Test piece 2 | 198.5 | 1.43E−05 | −2.11E−04 | 3.11E−03 |
| | | | | 296.8 | 1.44E−05 | −2.17E−04 | 3.26E−03 |
| | | | | 394.9 | 1.39E−05 | −2.15E−04 | 3.35E−03 |
| | | | | 492.9 | 1.33E−05 | −2.12E−04 | 3.36E−03 |
| | | | Test piece 3 | 198.0 | 1.37E−05 | −2.07E−04 | 3.14E−03 |
| | | | | 296.4 | 1.37E−05 | −2.14E−04 | 3.32E−03 |
| | | | | 394.5 | 1.32E−05 | −2.14E−04 | 3.47E−03 |
| | | | | 492.4 | 1.27E−05 | −2.11E−04 | 3.49E−03 |
| | | (Ti$_{0.5}$Zr$_{0.5}$)NiSn | Test piece 1 | 198.3 | 1.67E−05 | −1.92E−04 | 2.20E−03 |
| | | | | 296.5 | 1.62E−05 | −2.01E−04 | 2.49E−03 |
| | | | | 394.5 | 1.49E−05 | −2.04E−04 | 2.78E−03 |
| | | | | 492.4 | 1.39E−05 | −1.98E−04 | 2.82E−03 |
| | | | Test piece 2 | 197.8 | 1.70E−05 | −1.92E−04 | 2.17E−03 |
| | | | | 296.0 | 1.64E−05 | −2.02E−04 | 2.49E−03 |
| | | | | 394.2 | 1.51E−05 | −2.04E−04 | 2.76E−03 |
| | | | | 492.0 | 1.41E−05 | −1.99E−04 | 2.82E−03 |
| | | | Test piece 3 | 197.9 | 1.69E−05 | −1.89E−04 | 2.12E−03 |
| | | | | 296.1 | 1.64E−05 | −2.01E−04 | 2.45E−03 |
| | | | | 394.2 | 1.51E−05 | −2.03E−04 | 2.71E−03 |
| | | | | 492.1 | 1.41E−05 | −1.97E−04 | 2.76E−03 |
| | | | | 590.7 | 1.30E−05 | −1.81E−04 | 2.53E−03 |
| | | TiNiSn | Test piece 1 | 199.2 | 4.45E−06 | −7.33E−05 | 1.21E−03 |
| | | | | 297.7 | 4.64E−06 | −7.94E−05 | 1.36E−03 |
| | | | | 395.9 | 4.64E−06 | −8.36E−05 | 1.51E−03 |
| | | | | 493.9 | 4.71E−06 | −8.40E−05 | 1.50E−03 |
| | | | Test piece 2 | 198.6 | 4.50E−06 | −7.17E−05 | 1.14E−03 |
| | | | | 297.0 | 4.68E−06 | −7.77E−05 | 1.29E−03 |
| | | | | 395.2 | 4.67E−06 | −8.11E−05 | 1.41E−03 |
| | | | | 493.2 | 4.74E−06 | −8.30E−05 | 1.45E−03 |
| | | | Test piece 3 | 198.4 | 4.39E−06 | −7.20E−05 | 1.18E−03 |
| | | | | 296.7 | 4.58E−06 | −7.93E−05 | 1.37E−03 |
| | | | | 394.8 | 4.58E−06 | −8.36E−06 | 1.53E−03 |
| | | | | 492.8 | 4.64E−06 | −8.47E−05 | 1.55E−03 |
| | Comparative Example 1 | (Ti$_{0.5}$Zr$_{0.5}$)NiSn Book mold alloy | | 198.5 | 5.04E−06 | −4.87E−05 | 4.70E−04 |
| | | | | 296.9 | 5.46E−06 | −6.69E−05 | 8.21E−04 |
| | | | | 395.1 | 5.30E−06 | −7.92E−06 | 1.18E−03 |
| | | | | 493.0 | 5.23E−06 | −8.07E−05 | 1.24E−03 |

Example 2

Electrolytic iron (purity: 99% or more), ferrovanadium (Fe—V, JIS FV1, V purity: 87%) and Al metal were weighed to give a Heuslar-type Fe$_2$(V$_x$Ti$_{1-x}$)(Al$_y$Si$_{1-y}$) (0≦x<1, 0<y<1) composition after casting, and high-frequency melted at a temperature up to 1,700° C. under 0.1 MPa in an Ar atmosphere. Thereafter, by using a strip casting apparatus shown in FIG. 1, the molten metal was poured from the crucible 1 through the tundish 2 on the water-cooled copper roll 3 rotating at a spherical velocity of 0.9 m/sec to produce an alloy flake 5, and the alloy flake was collected in the Ltd. The average particle size d50 of the obtained powder was 13 μm. The yield of the powder was 60% based on the amount charged. The obtained powder was shaped into a size of 15 mm×15 mm×30 mm under a shaping pressure of 3.0 t/cm$^2$ by a shaping machine in a glove box controlled to an oxygen concentration of 300 ppm or less, and then kept at 1,380° C. for 3 hours in vacuum, thereby obtaining a sintered body.

A block of 4 mm×4 mm×15 mm was cut out from the sintered body and measured for the Seebeck coefficient α, specific resistance σ and power factor Pf=α$^2$/σ at 200 to 500° C. by using a thermoelectric property evaluating apparatus, ZEM-2 manufactured by ULVAC-RIKO, Inc.

These measurement results of Example 2 and Comparative Example 2 are shown in Tables 2 and 3.

TABLE 2

Thermoelectric Properties of Heuslar Element Fe—V—Al

| Type | Sample | | Temperature of Sample | Resistivity ($\sigma = \Omega \cdot m$) | Seebeck Coefficient ($\alpha = V/°C$) | Power Factor ($\alpha^2\sigma^{-1}$) |
|---|---|---|---|---|---|---|
| n | $Fe_2V(Al_{0.8}Si_{0.2})$ | Test piece 1 | 53.6 | 2.40E−06 | −9.71E−05 | 3.94E−03 |
| | | | 101.0 | 2.68E−06 | −9.84E−05 | 3.61E−03 |
| | | | 198.9 | 3.16E−06 | −9.63E−05 | 2.93E−03 |
| | | | 297.2 | 3.40E−06 | −7.87E−05 | 1.82E−03 |
| | | | 395.3 | 3.43E−06 | −5.99E−05 | 1.05E−03 |
| | | Test piece 2 | 54.6 | 2.36E−06 | −9.99E−05 | 4.23E−03 |
| | | | 100.9 | 2.62E−06 | −1.02E−04 | 4.00E−03 |
| | | | 198.6 | 3.08E−06 | −9.79E−05 | 3.11E−03 |
| | | | 296.8 | 3.32E−06 | −7.94E−05 | 1.90E−03 |
| | | | 395.0 | 3.34E−06 | −6.07E−05 | 1.10E−03 |
| | $Fe_2V(Al_{0.85}Si_{0.15})$ | Test piece 1 | 54.1 | 2.56E−06 | −1.12E−04 | 4.89E−03 |
| | | | 101 | 2.91E−06 | −1.16E−04 | 4.60E−03 |
| | | | 198.5 | 3.47E−06 | −1.09E−04 | 3.42E−03 |
| | | | 296.7 | 3.72E−06 | −8.45E−05 | 1.92E−03 |
| | | | 394.9 | 3.70E−06 | −6.07E−05 | 9.97E−04 |
| | | Test piece 2 | 53.9 | 2.73E−06 | −1.13E−04 | 4.64E−03 |
| | | | 100.9 | 3.05E−06 | −1.12E−04 | 4.11E−03 |
| | | | 198.2 | 3.49E−06 | −9.89E−05 | 2.80E−03 |
| | | | 296.3 | 3.62E−06 | −7.42E−05 | 1.52E−03 |
| | | | 394.2 | 3.55E−06 | −5.30E−05 | 7.89E−04 |
| | $Fe_2V(A_{l0.9}Si_{0.1})$ | Test piece 1 | 54.2 | 3.89E−06 | −1.18E−04 | 3.58E−03 |
| | | | 101.7 | 4.20E−06 | −1.11E−04 | 2.95E−03 |
| | | | 200.0 | 4.47E−06 | −8.92E−05 | 1.78E−03 |
| | | | 298.8 | 4.33E−06 | −8.15E−05 | 8.72E−04 |
| | | | 397.1 | 4.09E−06 | −4.19E−05 | 4.30E−04 |
| | | Test piece 2 | 55.2 | 3.77E−06 | −1.18E−04 | 3.71E−03 |
| | | | 101.0 | 4.03E−06 | −1.12E−04 | 3.10E−03 |
| | | | 198.6 | 4.28E−06 | −9.10E−05 | 1.93E−03 |
| | | | 296.9 | 4.16E−06 | −6.27E−05 | 9.45E−04 |
| | | | 395.0 | 3.92E−06 | −4.32E−05 | 4.76E−04 |
| | $Fe_2VAl$ | Test piece 1 | 54.3 | 9.02E−06 | −6.02E−05 | 4.02E−04 |
| | | | 100.8 | 7.72E−06 | −4.34E−05 | 2.44E−04 |
| | | | 197.5 | 5.81E−06 | −2.44E−05 | 1.03E−04 |
| | | | 295.0 | 4.72E−06 | −1.57E−05 | 5.24E−05 |
| | | | 392.5 | 4.11E−06 | −1.31E−05 | 4.16E−05 |
| | | | 489.9 | 3.75E−06 | −1.25E−05 | 4.18E−05 |
| | | Test piece 2 | 54.6 | 9.21E−06 | −5.97E−05 | 3.87E−04 |
| | | | 101.2 | 7.82E−06 | −4.31E−05 | 2.38E−04 |
| | | | 198.2 | 5.80E−06 | −2.40E−05 | 9.95E−05 |
| | | | 295.8 | 4.68E−06 | −1.57E−05 | 5.26E−05 |
| | | | 393.2 | 4.07E−06 | −1.30E−05 | 4.15E−05 |
| | | | 490.7 | 3.71E−06 | −1.29E−05 | 4.46E−05 |

TABLE 3

Thermoelectric Properties of Heuslar Element Fe—V—Al

| Type | Sample | | Temperature of Sample | Resistivity ($\sigma = \Omega \cdot m$) | Seebeck Coefficient ($\alpha = V/°C$) | Power Factor ($\alpha^2\sigma^{-1}$) |
|---|---|---|---|---|---|---|
| p | $Fe_2(V_{0.5}Ti_{0.5})Al$ | Test piece 1 | 54.7 | 1.05E−06 | 4.26E−05 | 1.72E−03 |
| | | | 101.2 | 1.21E−06 | 4.67E−05 | 1.81E−03 |
| | | | 198.5 | 1.55E−06 | 5.44E−05 | 191E−03 |
| | | | 296.5 | 1.90E−06 | 5.90E−05 | 1.83E−03 |
| | | | 394.3 | 2.25E−06 | 5.95E−05 | 1.58E−03 |
| | | Test piece 2 | 54.2 | 1.02E−06 | 4.46E−05 | 1.94E−03 |
| | | | 101.3 | 1.18E−06 | 4.92E−05 | 2.06E−03 |
| | | | 198.6 | 1.50E−06 | 5.63E−05 | 2.10E−03 |
| | | | 296.5 | 1.86E−06 | 6.00E−05 | 1.94E−03 |
| | | | 394.3 | 2.20E−06 | 6.03E−05 | 1.66E−03 |
| | $Fe_2(V_{0.65}Ti_{0.35})Al$ | Test piece 1 | 54.4 | 1.01E−06 | 4.49E−05 | 1.99E−03 |
| | | | 101.3 | 1.16E−06 | 4.98E−05 | 2.13E−03 |
| | | | 198.8 | 1.50E−06 | 5.90E−05 | 2.32E−03 |
| | | | 296.9 | 1.85E−06 | 6.38E−05 | 2.19E−03 |
| | | | 394.9 | 2.20E−06 | 6.13E−05 | 1.70E−03 |

TABLE 3-continued

Thermoelectric Properties of Heuslar Element Fe—V—Al

| Type | Sample | | Temperature of Sample | Resistivity ($\sigma = \Omega \cdot m$) | Seebeck Coefficient ($\alpha = V/^\circ C.$) | Power Factor ($\alpha^2\sigma^{-1}$) |
|---|---|---|---|---|---|---|
| | | Test piece 2 | 54.2 | 1.05E−06 | 4.39E−05 | 1.84E−03 |
| | | | 101.1 | 1.21E−06 | 4.94E−05 | 2.02E−03 |
| | | | 198.4 | 1.56E−06 | 5.88E−05 | 2.22E−03 |
| | | | 296.6 | 1.92E−06 | 6.37E−05 | 2.11E−03 |
| | | | 394.5 | 2.27E−06 | 6.14E−05 | 1.66E−03 |
| $Fe_2(V_{0.8}Ti_{0.2})Al$ | Test piece 1 | | 54.6 | 1.24E−06 | 5.31E−05 | 2.28E−03 |
| | | | 101.5 | 1.41E−06 | 5.94E−05 | 2.49E−03 |
| | | | 198.7 | 1.81E−06 | 6.95E−05 | 2.66E−03 |
| | | | 296.6 | 2.22E−06 | 7.07E−05 | 2.25E−03 |
| | | | 394.3 | 2.58E−06 | 6.16E−05 | 1.47E−03 |
| | | Test piece 2 | 54.7 | 1.25E−06 | 5.27E−05 | 2.23E−03 |
| | | | 101.5 | 1.42E−06 | 5.89E−05 | 2.44E−03 |
| | | | 198.8 | 1.83E−06 | 6.85E−05 | 2.57E−03 |
| | | | 296.9 | 2.24E−06 | 6.95E−05 | 2.15E−03 |
| | | | 394.8 | 2.60E−06 | 6.06E−05 | 1.41E−03 |
| $Fe_2(V_{0.9}Ti_{0.1})Al$ | Test piece 1 | | 55.1 | 2.33E−06 | 7.01E−05 | 2.11E−03 |
| | | | 101.9 | 2.55E−06 | 7.29E−05 | 2.09E−03 |
| | | | 199.9 | 2.94E−06 | 7.27E−05 | 1.80E−03 |
| | | | 298.4 | 3.11E−06 | 5.58E−05 | 1.00E−03 |
| | | | 396.6 | 3.12E−06 | 3.53E−05 | 3.99E−04 |
| | | Test piece 2 | 54.1 | 2.43E−06 | 6.99E−05 | 2.01E−03 |
| | | | 101.1 | 2.64E−06 | 7.42E−05 | 2.09E−03 |
| | | | 198.7 | 3.01E−06 | 7.39E−05 | 1.81E−03 |
| | | | 297.0 | 3.17E−06 | 5.53E−05 | 9.66E−04 |
| | | | 395.0 | 3.15E−06 | 3.37E−05 | 3.61E−04 |
| $Fe_2(V_{0.97}Ti_{0.03})Al$ | Test piece 1 | | 54.8 | 7.43E−06 | 6.74E−05 | 6.11E−04 |
| | | | 101.5 | 6.69E−06 | 5.74E−05 | 4.92E−04 |
| | | | 199.4 | 5.40E−06 | 3.63E−05 | 2.43E−04 |
| | | | 297.9 | 4.57E−06 | 1.88E−05 | 7.73E−05 |
| | | | 396.0 | 4.12E−06 | 7.53E−06 | 1.38E−05 |
| | | | 494.0 | 3.84E−06 | 3.83E−07 | 3.81E−08 |
| | | Test piece 2 | 54.9 | 9.28E−06 | 7.89E−05 | 6.70E−04 |
| | | | 101.2 | 8.51E−06 | 6.90E−05 | 5.59E−04 |
| | | | 198.8 | 6.95E−06 | 4.47E−05 | 2.87E−04 |
| | | | 297.1 | 5.88E−06 | 2.42E−05 | 9.99E−05 |
| | | | 395.2 | 5.29E−06 | 1.08E−05 | 2.21E−05 |

It should be noted that the data of n-type thermoelectric semiconductor are shown in Table 2, and the data of p-type thermoelectric semiconductor are shown in Table 3.

INDUSTRIAL APPLICABILITY

The Heuslar alloy of the present invention can be used as a thermoelectric semiconductor for thermoelectric conversion systems.

The invention claimed is:

1. A method for producing a Heuslar alloy, comprising quench-solidifying a molten alloy at a cooling rate of $1 \times 10^2$ to $1 \times 10^{3\circ}$ C./sec to produce a Heuslar alloy having a Heuslar phase and the ratio of strongest peak of the Heuslar phase is 90% or more in an as-cast state represented by the formula: $A_{3-x}B_xC$ (wherein A and B each is at least one member selected from Fe, Co, Ni, Ti, V, Cr, Zr, Hf, Nb, Mo, Ta and W, and C is at least one member selected from Al, Ga, in, Si, Ge and Sn).

2. A method for producing the Heuslar alloy having the ratio of strongest peak of the Heuslar phase is 90% or more in an as-cast state represented by the formula: $Fe_2V_{1-x}A_xAl_{1-y}B_y$ (wherein A is at least one member selected from Co, Ni, Ti, V, Cr, Zr, Hf, Nb, Mo, Ta and W, B is at least one member selected from Al, Ga, In, Si, Ge and Sn, $0 \leq x \leq 0.8$, $0 \leq y \leq 0.3$), comprising quench-solidifying a molten alloy at a cooling rate of $1 \times 10^2$ to $1 \times 10^{3\circ}$ C./sec.

* * * * *